United States Patent
Kim et al.

(10) Patent No.: US 11,901,371 B2
(45) Date of Patent: Feb. 13, 2024

(54) CONTACT STRUCTURE AND DISPLAY DEVICE INCLUDING THE SAME

(71) Applicant: LG DISPLAY CO., LTD., Seoul (KR)

(72) Inventors: YounSub Kim, Seongnam-si (KR); JongSik Shim, Paju-si (KR); ByeongUk Gang, Paju-si (KR); SeongHwan Hwang, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/952,419

(22) Filed: Sep. 26, 2022

(65) Prior Publication Data

US 2023/0018904 A1 Jan. 19, 2023

Related U.S. Application Data

(62) Division of application No. 17/200,531, filed on Mar. 12, 2021, now Pat. No. 11,488,986, which is a
(Continued)

(30) Foreign Application Priority Data

Dec. 11, 2017 (KR) .......................... 10-2017-0169193

(51) Int. Cl.
*H01L 27/12* (2006.01)
*H01L 23/522* (2006.01)
(Continued)

(52) U.S. Cl.
CPC .............. *H01L 27/124* (2013.01); *G02F 1/13* (2013.01); *H01L 23/5226* (2013.01); *H01L 23/528* (2013.01)

(58) Field of Classification Search
CPC . H01L 27/124; H01L 23/5226; H01L 23/528; H01L 51/5237; H01L 27/3246;
(Continued)

(56) References Cited

U.S. PATENT DOCUMENTS 6,040,589 A  3/2000 Zhang et al.
6,376,861 B1  4/2002 Yaegashi et al.
(Continued)

FOREIGN PATENT DOCUMENTS

CN  10-3424915 A  12/2013
CN  104614906 A  5/2015
(Continued)

OTHER PUBLICATIONS

Chinese Office Action dated Nov. 1, 2022 issued in Patent Application No. 201810575575.4 w/English Translation (10 pages).
(Continued)

*Primary Examiner* — David Vu
(74) *Attorney, Agent, or Firm* — POLSINELLI PC

(57) ABSTRACT

In the contact structure according to an exemplary aspect of the present disclosure and a display device including the same, the pixel may be designed regardless of the size of the contact hole by designing a size (or an area) of the contact hole to be larger than the contact area and applying different structures depending on the characteristics of the lower layer. Therefore, the size of the contact hole is increased so that the halftone mask may be easily applied and the number of masks may be advantageously reduced. Further, a degree of freedom of metal in the pixel design is increased so that the pixel may be designed in a high resolution model and the aperture ratio is increased without having the electrode margin. The contact structure comprises: a lower layer; at least a first insulating layer on the lower layer, the first insulating layer having a predetermined contact hole to expose a part of the lower layer; and an upper layer on the first insulating layer to be in contact with the lower layer through the contact hole, wherein the contact hole has a relatively larger area than a contact area where the upper layer and the lower layer are in contact with each other.

5 Claims, 15 Drawing Sheets

Related U.S. Application Data division of application No. 16/165,059, filed on Oct. 19, 2018, now Pat. No. 10,985,189.

(51) Int. Cl.
*H01L 23/528* (2006.01)
*G02F 1/13* (2006.01)

(58) Field of Classification Search
CPC ....... H01L 27/3258; H01L 51/56; G02F 1/13; H10K 59/122; H10K 59/124; H10K 50/84; H10K 71/00
See application file for complete search history.

(56) References Cited

U.S. PATENT DOCUMENTS 7,656,087 B2 * 2/2010 Kim .................. H01L 21/76804
313/506
2016/0132148 A1 5/2016 Han et al.

FOREIGN PATENT DOCUMENTS

| JP | 10-115841 A | 5/1998 |
|----|----|----|
| KR | 0493976 B1 | 9/2005 |
| KR | 2017-0033929 A | 4/2009 |
| KR | 20150072118 A | 6/2015 |
| KR | 20160018048 A | 2/2016 |
| KR | 20160127459 A | 11/2016 |

OTHER PUBLICATIONS

Korean Office Action issued in co-pending Korean Patent Application No. 10-2017-0169193, dated Jul. 22, 2019.
Office Action dated Jan. 16, 2019 in the corresponding Korean Patent Application No. 10-2017-0169193, pp. 1-7.

* cited by examiner

CONTACT STRUCTURE AND DISPLAY DEVICE INCLUDING THE SAME

CROSS REFERENCE TO RELATED APPLICATIONS

This application is a divisional of U.S. patent application Ser. No. 17/200,531, filed on Mar. 12, 2021, which is a divisional of U.S. application Ser. No. 16/165,059, filed on Oct. 19, 2018, now U.S. Pat. No. 10,985,189, issued on Apr. 20, 2021, which claims the priority of Korean Patent Application No. 10-2017-0169193 filed on Dec. 11, 2017, in the Korean Intellectual Property Office, of which the full disclosures of these applications are incorporated herein by reference for all purposes.

BACKGROUND

Field of the Disclosure

The present disclosure relates to a contact structure and a display device including the same, and more particularly, to a contact structure and a display device which can facilitate a pixel design in a high resolution model.

Description of the Background

Currently, as it enters the full-scale information era, a field of a display device which visually expresses electrical information signals has been rapidly developed and studies are continued to improve performances of various display devices such as thin profile, light weight, and low power consumption.

A representative display device includes a liquid crystal display device (LCD), a field emission display device (FED), an electro-wetting display device (EWD), and an organic light emitting display device (OLED).

Among these, the electroluminescent display device including an organic light emitting display device is a self-emitting display device so that a separate light source is not necessary, which is different from the liquid crystal display device. Therefore, the electroluminescent display device can be manufactured to be thin and light. Further, since the field emission display device is advantageous not only in power consumption but also in color implementation, a response speed, a viewing angle, and a contrast ratio (CR) due to the lower voltage driving, it is expected to be utilized in various fields.

The electroluminescent display device is configured by disposing a light emitting layer which uses an organic material between two electrodes referred to as an anode and a cathode. When holes in the anode are injected to the light emitting layer and electrons in the cathode are injected to the light emitting layer, the injected holes and electrons are recombined and form excitons in the light emitting layer to emit light.

Such a light emitting layer includes a host material and a dopant material so that interactions between two materials occur. The host serves to generate excitons from the electrons and holes and transmit energy to the dopant. The dopant is a dye organic material and a small amount of dopant is added to receive energy from the host and convert the energy into light.

In order to increase the size of the display device and implement a high resolution, it is necessary to ensure a high aperture ratio. Further, a gate redundancy pattern for repairing a short circuit failure between a horizontal line of the gate line and a vertical line of a data line/power line causes a problem.

Only an interlayer insulating layer is interposed between intersections of the horizontal line and the vertical line so that a static electrical failure is caused by a short distance, and a short circuit between the horizontal line and the vertical line due to foreign matter or a failure due to a state of an insulating layer above the gate line may be caused. Therefore, a structure for repairing needs to be designed in the pixel to improve a yield. Therefore, in the related art, the gate redundancy pattern is applied to a position where the horizontal line and the vertical line intersect each other. The gate redundancy pattern is formed to occupy a predetermined region above and below the gate line so that it causes the reduction of the aperture ratio in the pixel. Further, due to the addition of the gate redundancy pattern in the pixel, it is difficult to design the pixels in a high resolution model.

SUMMARY

The inventors of the present disclosure noted that only the interlayer insulating layer is interposed between the intersections of the horizontal line and the vertical line so that it is vulnerable to the short circuit failure and the short circuit failure is affected by the distance between wiring lines and a thickness of the interlayer insulating layer affects a capacity of a capacitor so that it is difficult to increase the thickness. However, the inventors noted that the thicknesses of the gate insulating layer and the buffer layer can be increased regardless of the capacity of capacitor, and thus, invented a structure in which the gate insulating layer and the buffer layer are interposed between the horizontal line and the vertical line by disposing a data line/power line on a different layer from the related art to suppress a short circuit failure.

That is, the vertical line of the data line/power line is disposed on the same layer as a light shielding layer which is the lowest layer and the horizontal line of the gate line is disposed on the same layer as the gate electrode so that an electrode or a wiring line divided from the vertical line is disposed on the same layer as a source/drain electrode. Therefore, the gate insulating layer and the buffer layer may be interposed between the vertical line and the horizontal line. In this case, the gate insulating layer/buffer layer is irrelevant to the capacity of the capacitor so that the short circuit failure caused at the intersection of the vertical line and the horizontal line may be suppressed by increasing the thickness of the gate insulating layer and/or the buffer layer, without using the gate redundancy pattern.

Therefore, an object to be achieved by the present disclosure is to provide a display device which may suppress a short circuit failure generated between the vertical line and the horizontal line without using a gate redundancy pattern.

In the meantime, a contact structure of the related art has a structure in which a contact hole is covered by an upper layer and a lower layer, for example, an upper electrode and a lower electrode. In this case, a size (or an area) of the contact hole is the same as a contact area where the upper and lower electrodes are in contact (or connected) with each other.

In this case, there is a restriction in a pixel design due to a minimum size for patterning a contact hole.

Further, an overlay margin is necessary between the lower electrode and the contact hole and between the upper electrode and the contact hole and thus a degree of freedom of metal in the pixel design is reduced. That is, since the upper electrode needs to cover the contact hole so that the lower electrode is not damaged by an etchant of the upper electrode, a margin for the upper electrode is necessary. Further, in order to pattern the contact hole so as not to deviate from the lower electrode, a margin for the lower electrode is also necessary. As described above, the contact structure of the related art requires margins for the upper and lower electrodes so that the degree of freedom of metal is reduced in the pixel design.

Therefore, the inventors of the present disclosure noted that a margin of the contact hole is generated because a size (or an area) of the contact hole is equal to a contact area and when different contact hole structures are applied in consideration of a characteristic of the lower layer, the pixel may be designed without having a restriction of the size of the contact hole. Therefore, the inventors invented a contact structure in which the pixel may be designed regardless of the size of the contact hole by designing a size (or an area) of the contact hole to be larger than the contact area and applying different structures depending on the characteristics of the lower layer.

That is, the size (or an area) of the contact hole is designed to be larger than the contact area and two existing contact holes are combined depending on the characteristic of the lower layer, a contact portion is formed on a side of metal or an upper electrode is formed to enclose the lower electrode in the form of a clad. Therefore, the pixel may be designed regardless of the size of the contact hole. As described above, when the size (or area) of the contact hole is designed to be larger than the contact area, the above-described upper and lower overlay margins are not necessary so that the pixel may be designed regardless of the size of the contact hole.

Therefore, another object to be achieved by the present disclosure is to provide a contact structure which may facilitate a pixel design in a high resolution model and a display device including the same.

Objects of the present disclosure are not limited to the above-mentioned objects, and other objects, which are not mentioned above, can be clearly understood by those skilled in the art from the following descriptions.

According to an aspect of the present disclosure, a contact structure includes: a lower layer, at least a first insulating layer disposed on the lower layer, the first insulating layer having a predetermined contact hole to expose a part of the lower layer, and an upper layer which is disposed on the first insulating layer to be in contact with the lower layer through the contact hole in which the contact hole has a relatively larger area than a contact area where the upper layer and the lower layer are in contact with each other.

According to another aspect of the present disclosure, a contact structure includes at least a first insulating layer on a substrate, the first insulating layer having a predetermined contact hole; and a lower layer and an upper layer sequentially stacked and contacted with each other within the contact hole, wherein the contact hole has a relatively larger area than a contact area where the upper layer and the lower layer are in contact with each other.

According to another aspect of the present disclosure, a display device includes the contact structure.

According to another aspect of the present disclosure, an display device includes: a data line on a substrate in a first direction, a first insulating layer on the data line, an active layer disposed on the first insulating layer, a gate line on the first insulating layer with at least a second insulating layer interposed therebetween in a second direction intersecting the first direction to divide a pixel region together with the data line, a gate electrode above the active layer with the second insulating layer interposed therebetween, a third insulating layer on the gate electrode and the gate line, a source electrode and a drain electrode on the third insulating layer, a fourth insulating layer on the source electrode and the drain electrode, a light emitting diode in a light emitting unit of the pixel region above the fourth insulating layer; and a contact hole configured in at least one insulating layer among the first insulating layer to the fourth insulating layer to allow components above and below the at least one insulating layer to be in contact with each other, in which the contact hole has a relatively larger area than a contact area in which the components above and below the at least one insulating layer are in contact with each other.

In one or more aspects, the first insulating layer and the second insulating layer may be interposed between the data line and the gate line.

In one or more aspects, the display device may further comprise a light shielding layer on the lowest layer of the substrate, wherein the data line is located on the same layer as the light shielding layer, and the gate line is located on the same layer as the gate electrode.

In one or more aspects, the third insulating layer may have a smaller thickness than each of the first insulating layer and the second insulating layer.

According to another aspect of the present disclosure, an display device includes: a data line and a power line on a substrate in a first direction; a first insulating layer on the data line; an active layer on the first insulating layer; a gate line on the first insulating layer with a second insulating layer interposed therebetween in a second direction intersecting the first direction to divide a pixel region together with the data line; a gate electrode above the active layer with the second insulating layer interposed therebetween; a third insulating layer on the gate electrode and the gate line; an interlayer insulating layer between the first insulating layer and the third insulating layer; a bridge line on the interlayer insulating layer; a source electrode and a drain electrode on the third insulating layer; a fourth insulating layer on the source electrode and the drain electrode; a light emitting diode in a light emitting unit of the pixel region above the fourth insulating layer; and a contact hole configured in at least one insulating layer among the first insulating layer to the fourth insulating layer and the interlayer insulating layer to allow components above and below the at least one insulating layer to be in contact with each other, wherein the contact hole has a relatively larger area than a contact area in which the components above and below the at least one insulating layer are in contact with each other.

In one or more aspects, the bridge line may extend to a pixel region which is adjacent in a direction parallel to the second direction.

In one or more aspects, the bridge line which extends in the adjacent pixel region may be connected to the source electrode of the adjacent pixel region through the contact hole.

In one or more aspects, one side of the bridge line may vertically extend along the power line to be connected to the power line therebelow through the contact hole.

In one or more aspects, the first insulating layer and the second insulating layer may be interposed between the data line and the gate line.

In one or more aspects, the display device may further comprise a light shielding layer on the lowest layer of the substrate, wherein the data line is located on the same layer as the light shielding layer, and the gate line is located on the same layer as the gate electrode.

In one or more aspects, each of the third insulating layer and the interlayer insulating layer may have a smaller thickness than each of the first insulating layer and the second insulating layer.

Other detailed matters of the aspects are included in the detailed description and the drawings.

According to the present disclosure, the vertical line of the data line/power line is disposed on the same layer as the light shielding layer which is the lowest layer and the horizontal line of the gate line is disposed on the same layer as the gate electrode so that a short circuit failure generated between the vertical line and the horizontal line may be avoided. Therefore, a gate redundancy pattern in the pixel may be removed so that a yield in the high resolution model is improved and an additional aperture ratio is also ensured.

Further, according to the present disclosure, the pixel may be designed regardless of the size of the contact hole by designing a size (or an area) of the contact hole to be larger than the contact area and applying different structures depending on the characteristics of the lower layer. Therefore, the size of the contact hole is increased so that the halftone mask may be easily applied and the number of masks may be advantageously reduced. Further, a degree of freedom of metal in the pixel design is increased so that the pixel design is enabled in a high resolution model and the aperture ratio is increased without having the electrode margin.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
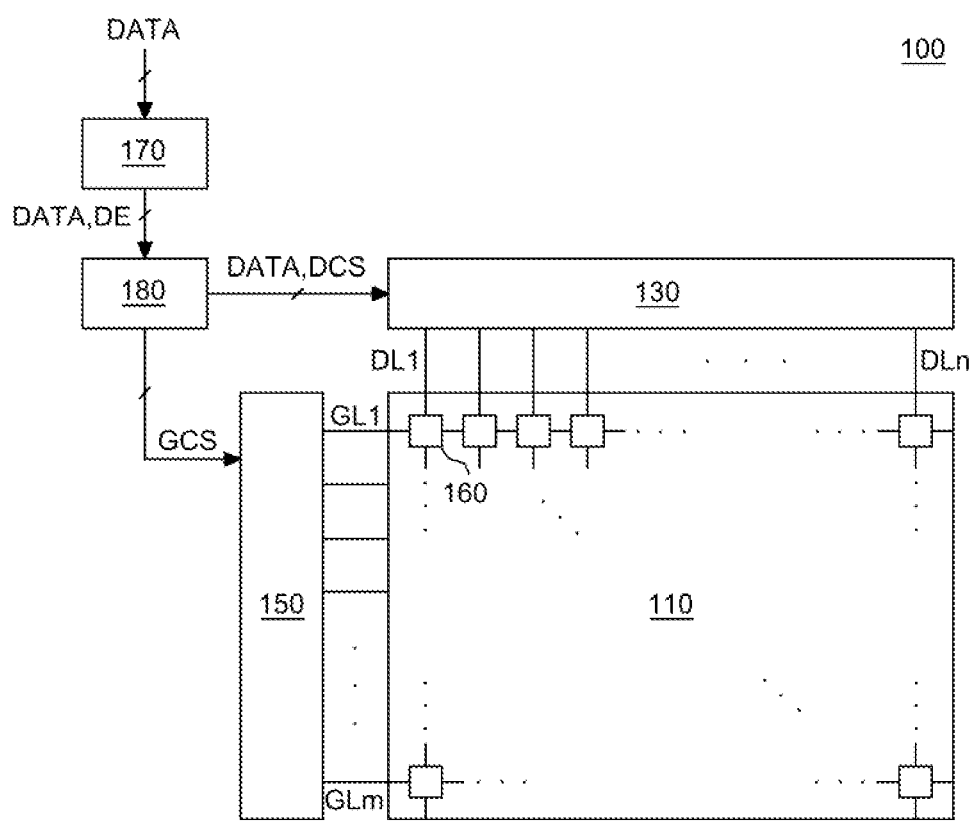
FIG. 1 is a block diagram schematically illustrating an electroluminescent display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to exemplary aspect disclosed herein but will be implemented in various forms. The exemplary aspects are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Further, in the following description, a detailed explanation of known related technologies may be omitted to avoid unnecessarily obscuring the subject matter of the present disclosure. The terms such as "including," "having," and "comprise" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" other element or layer, it means that another layer or another element may be disposed directly on the other element or a third part may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely bonded to or combined with each other and can be interlocked and operated in technically various ways understood by those skilled in the art, and the aspects can be carried out independently of or in association with each other.

Hereinafter, various exemplary aspects of the present disclosure will be described in detail with reference to accompanying drawings.

FIG. 1 is a block diagram schematically illustrating an electroluminescent display device according to an exemplary aspect of the present disclosure.

Referring to FIG. 1, an electroluminescent display device 100 according to an exemplary aspect of the present disclosure may include a display panel 110, a data driving integrated circuit (IC) 130, a gate driving integrated circuit 150, an image processing unit 170, and a timing controller 180.

The display panel 110 may include a plurality of sub pixels 160. The plurality of sub pixels 160 is disposed in a row direction and a column direction in a matrix form. For example, as illustrated in FIG. 1, the plurality of sub pixels 160 may be disposed in m rows and n columns. Hereinafter, for the convenience of description, among the plurality of sub pixels 160, a group of sub pixels 160 disposed in the row direction is defined as a row sub pixel and a group of sub pixels 160 disposed in the column direction is defined as a column sub pixel.

The plurality of sub pixels 160 may implement light of a specific color, respectively. For example, the plurality of sub pixels 160 may be configured by a red sub pixel which implements red light, a green sub pixel which implements green light, and a blue sub pixel which implements blue light. In this case, a group of the red sub pixel, the green sub pixel, and the blue sub pixel may be referred to as one pixel.

The plurality of sub pixels 160 of the display panel 110 may be connected to gate lines GL1 to GLm and data lines DL1 to DLn. For example, a first row sub pixel is connected to a first gate line GL1 and a first column sub pixel is connected to a first data line DL1. Further, second to m-th row sub pixels may be connected to second to m-th gate lines GL2 to GLm, respectively. Further, second to n-th column sub pixels may be connected to second to n-th data lines DL2 to DLn, respectively. The plurality of sub pixels 160 may be configured to operate based on a gate voltage transmitted from the gate lines GL1 to GLm and a data voltage transmitted from the data lines DL1 to DLn.

The image processing unit 170 may output a data enable signal DE together with a data signal (image data) DATA which is supplied from the outside. The image processing unit 170 may output one or more of a vertical synchronization signal, a horizontal synchronization signal, and a clock signal in addition to the data enable signal DE.

The timing controller 180 may be supplied with various timing signals including the vertical synchronization signal, the horizontal synchronization signal, the data enable signal DE, and the clock signal together with the data signal DATA from the image processing unit 170. The timing controller 180 receives the data signal DATA, that is, input image data from the image processing unit 170 to convert the data signal to be suitable for a data signal format which can be processed in the data driving integrated circuit 130 to output the data signal DATA, that is, output image data. Further, in order to control the data driving integrated circuit 130 and the gate driving integrated circuit 150, the timing controller 180 receives the timing signal such as the vertical synchronization signal, the horizontal synchronization signal, the data enable signal (DE), and the clock signal to generate various control signals such as data control signal DCS or gate control signal GCS and output the control signals to the data driving integrated circuit 130 and the gate driving integrated circuit 150.

For example, in order to control the gate driving integrated circuit 150, the timing controller 180 outputs various gate control signals GCS including a gate start pulse GSP, a gate shift clock GSC, and a gate output enable signal GOE.

Here, the gate start pulse controls an operation start timing of one or more gate circuits which configure the gate driving integrated circuit 150. The gate shift clock is a clock signal which is commonly input to one or more gate circuits and controls a shift timing of the scan signal (gate pulse). The gate output enable signal designates timing information of one or more gate circuits.

Further, in order to control the data driving integrated circuit 130, the timing controller 180 outputs various data control signals DCS including a source start pulse SSP, a source sampling clock SSC, and a source output enable signal SOE.

Here, the source start pulse controls a data sampling start timing of one or more data circuits which configure the data driving integrated circuit 130. The source sampling clock is a clock signal which controls a sampling timing of data in each data circuit. The source output enable signal controls an output timing of the data driving integrated circuit 130.

The gate driving integrated circuit 150 sequentially supplies a scan signal of an on-voltage or an off-voltage to the gate lines GL1 to GLm in accordance with the control of the timing controller 180 to sequentially drive the gate lines GL1 to GLm.

According to a driving method, the gate driving integrated circuit 150 may be located only at one side of the display panel 110 or located at both sides if necessary.

The gate driving integrated circuit 150 may be connected to a bonding pad of the display panel 110 through a tape automated bonding (TAB) method or a chip on glass (COG) method. The gate driving integrated circuit may also be implemented in a gate in panel (GIP) type to be directly disposed in the display panel 110, or may be integrated in the display panel 110, if necessary.

The gate driving integrated circuit 150 may include a shift register or a level shifter.

When a specific gate line is open, the data driving integrated circuit 130 converts the output image data DATA received from the timing controller 180 into an analog data voltage to supply the converted analog data voltage to the data lines DL1 to DLn, thereby driving the data lines DL1 to DLn.

The data driving integrated circuit 130 is connected to the bonding pad of the display panel 110 by a tape automated bonding method or a chip on glass method or may be directly disposed on the display panel 110. If necessary, the data driving integrated circuit 130 may be integrated in the display panel 110.

The data driving integrated circuit 130 may be implemented in a chip on film (COF) manner. In this case, one end of the data driving integrated circuit 130 is bonded to at least one source printed circuit board and the other end is bonded to the display panel 110.

The data driving integrated circuit 130 may include a logic unit including various circuits such as a level shifter or a latch unit, a digital analog converter DAC, and an output buffer.

A detailed structure of the pixel 160 will be described with reference to FIGS. 2 and 3.

Figure 2:
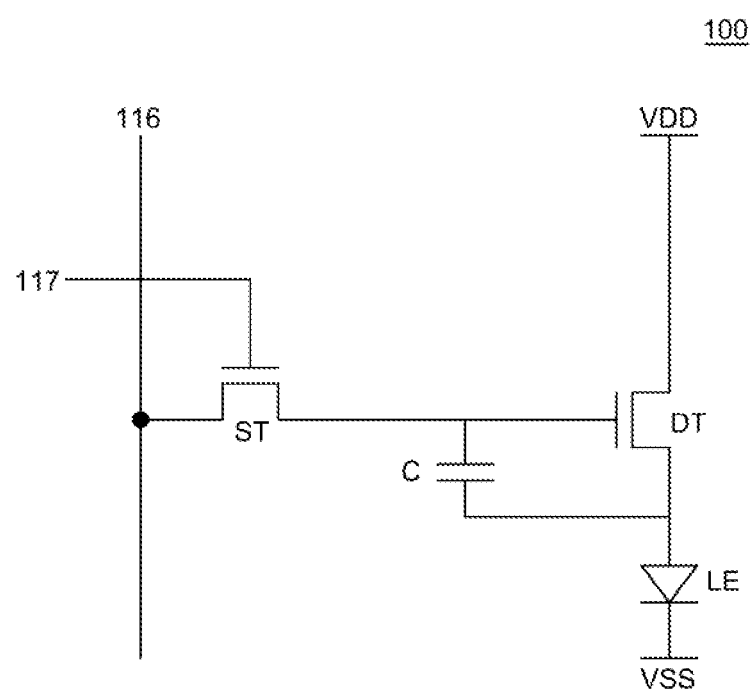
FIG. 2 is a circuit diagram of a pixel included in an electroluminescent display device according to an exemplary aspect of the present disclosure.

FIG. 2 is a circuit diagram of a pixel included in an electroluminescent display device according to an exemplary aspect of the present disclosure. Hereinafter, for the convenience of description, a structure and an operation when the electroluminescent display device according to the exemplary aspect of the present disclosure is a pixel circuit of 2T (transistor) 1C (capacitor) will be described, but the present disclosure is not limited thereto.

Referring to FIG. 2, in the electroluminescent display device 100 according to the exemplary aspect of the present disclosure, one pixel may include a switching transistor ST, a driving transistor DT, a compensation circuit (not illustrated), and a light emitting diode LE.

The light emitting diode LE may operate to emit light in accordance with a driving current formed by the driving transistor DT.

The switching transistor ST may perform a switching operation such that a data signal supplied through the data line 116 is stored in the capacitor C as a data voltage in response to a gate signal supplied through the gate line 117.

The driving transistor DT may operate to flow a constant driving current between a high potential power line VDD and a low potential power line VSS in response to the data voltage stored in the capacitor C.

Here, the compensation circuit is a circuit for compensating a threshold voltage of the driving transistor DT and includes one or more thin film transistors and capacitors. A configuration of the compensation circuit may vary depending on a compensating method.

As described above, in the electroluminescent display device 100 according to the exemplary aspect of the present disclosure, one pixel is configured by a 2T1C structure including a switching transistor ST, a driving transistor DT, a capacitor C, and a light emitting diode LE. However, when the compensation circuit is added, one pixel may be configured in various ways, such as 3T1C, 4T2C, 5T2C, 6T1C, 6T2C, 7T1C, or 7T2C.

Figure 3:
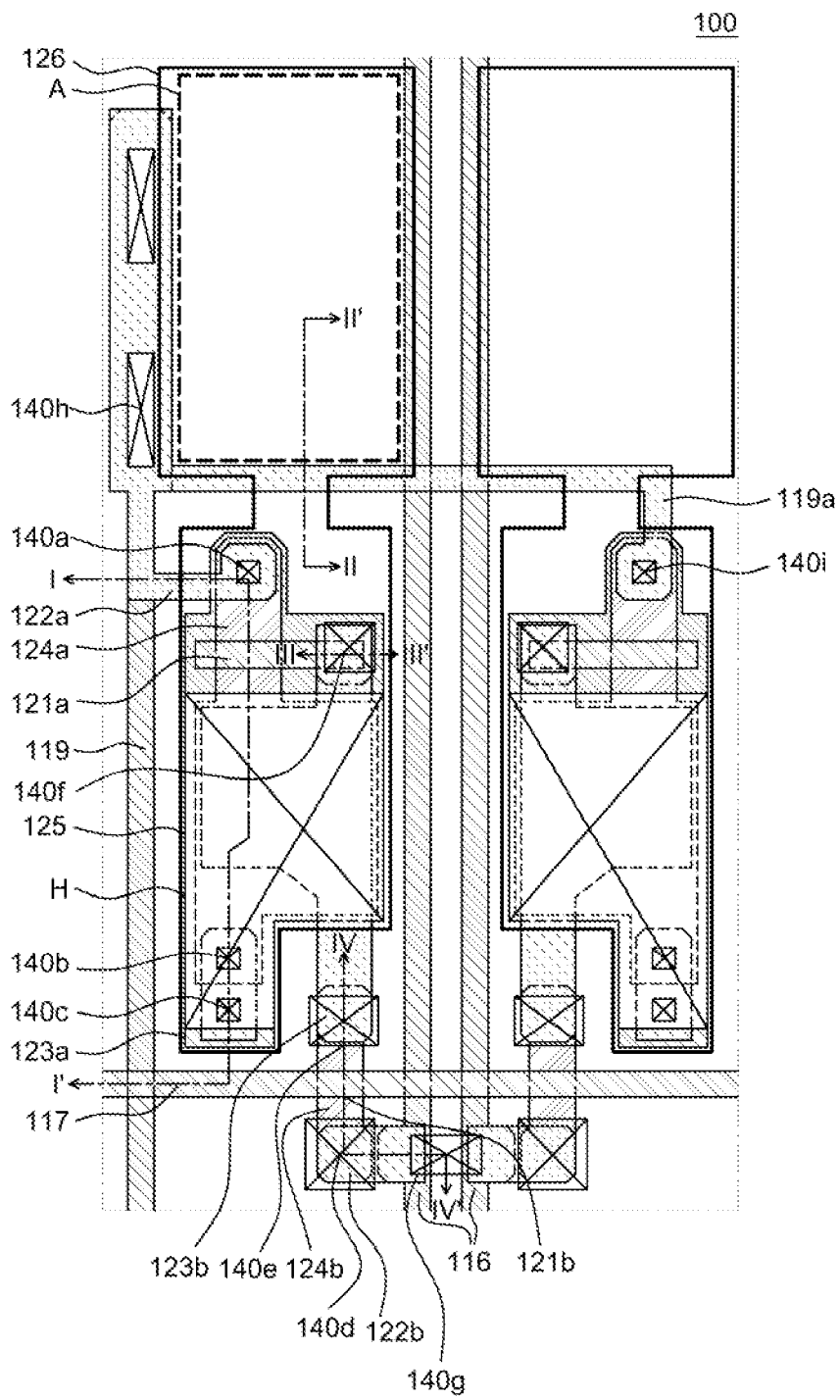
FIG. 3 is a plan view schematically illustrating an electroluminescent display device according to an exemplary aspect of the present disclosure.
Figure 4:
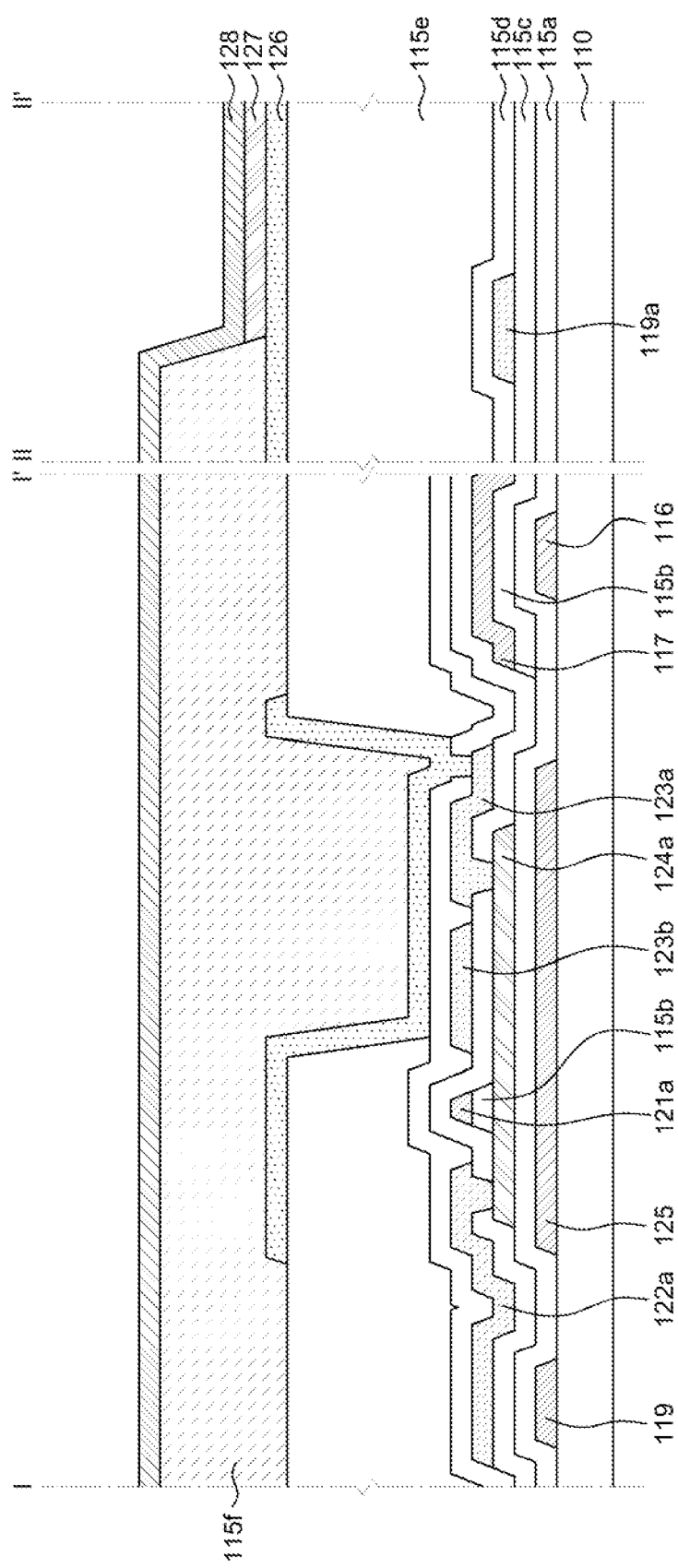
FIGS. 4 to 6 are views schematically illustrating a cross-sectional structure of an electroluminescent display device according to an exemplary aspect of the present disclosure illustrated in FIG. 3.
Figure 5:
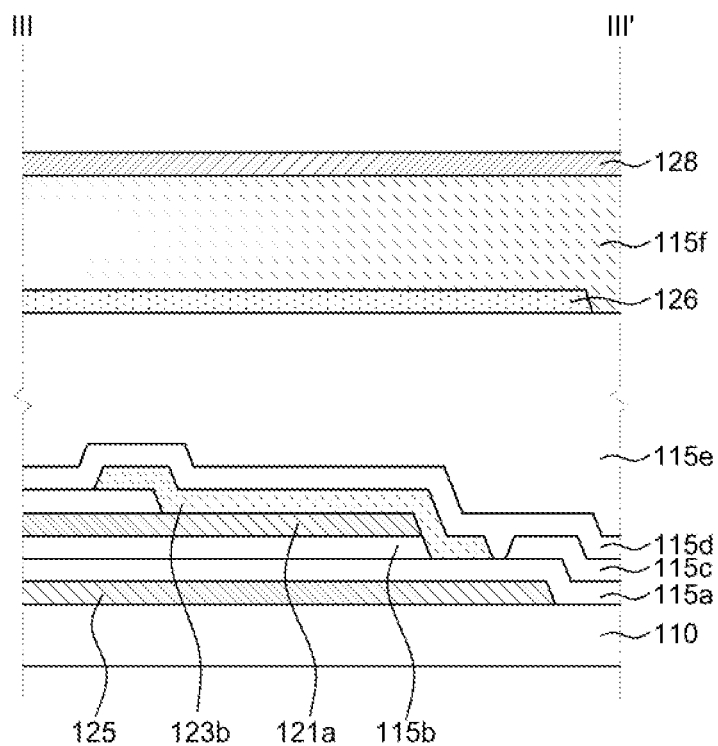
Figure 6:
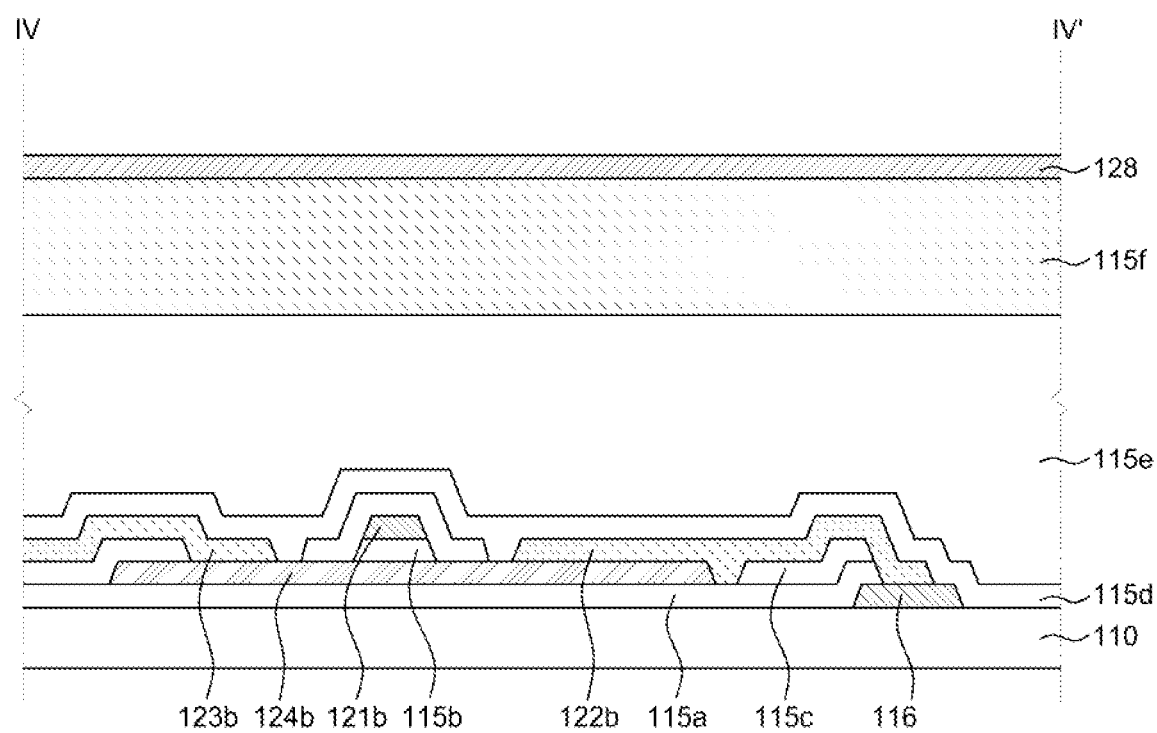

FIG. 3 is a plan view schematically illustrating an electroluminescent display device according to an exemplary aspect of the present disclosure. FIGS. 4 to 6 are views schematically illustrating a cross-sectional structure of an electroluminescent display device according to an exemplary aspect of the present disclosure illustrated in FIG. 3.

In this case, FIG. 3 schematically illustrates a planar structure of two adjacent pixels in an electroluminescent display device 100 according to an exemplary aspect of the present disclosure. For the convenience of description, FIG. 3 illustrates that one pixel is configured to have a 2T1C structure including a switching transistor, a driving transistor, a capacitor, and a light emitting diode as an example. However, as described above, when the compensation circuit is added, one pixel may be configured in various ways, such as 3T1C, 4T2C, 5T2C, 6T1C, 6T2C, 7T1C, or 7T2C.

FIGS. 4 to 6 schematically illustrate a part of cross-sections taken along the lines I-I', II-II', III-III', and IV-IV' in the electroluminescent display device 100 according to the exemplary aspect of the present disclosure illustrated in FIG. 3. Among them, FIG. 4 illustrates a part of a circuit unit including a driving transistor and a capacitor, a part of a light emitting unit including a light emitting diode, and a part of an intersection of a gate line 116 and a data line 117 as an example. FIG. 5 illustrates a part of a circuit unit in which a first gate electrode 121a of a driving transistor and a second drain electrode 123b of a switching transistor are connected as an example. FIG. 6 illustrates a part of a circuit unit in which a data line 116 and a second source electrode 122b of the switching transistor are connected as an example.

In this case, FIG. 3 illustrates that a contact structure according to the exemplary aspect of the present disclosure is applied to a part (shown in FIGS. 5 and 6) of the electroluminescent display device 100 according to the exemplary aspect of the present disclosure as an example, but the present disclosure is not limited thereto. The contact structure of the present disclosure will be described below.

Referring to FIGS. 3 to 6, in the electroluminescent display device 100 according to the exemplary aspect of the present disclosure, a gate line (or a scan line) 117, a data line 116, and a power line (or a power voltage line) 119 intersect on the substrate 110 to divide the pixel region. In addition, a sensing control line or a reference line may be further disposed.

The data line 116 and the power line 119 are disposed on the substrate 110 in a first direction. Further, the gate line 117 is disposed in a second direction which intersects the first direction to divide the pixel region together with the data line 116 and the power line 119. In this case, for the convenience of description, one pixel region may be divided into a light emitting unit where the light emitting diode emits light and a circuit unit configured by a plurality of driving circuits to supply a driving current to the light emitting diode.

The power line 119 may be disposed for one or more pixel regions, but the present disclosure is not limited thereto.

Together with the data line 116 and the power line 119, the reference line may be disposed on the same layer as the data line 116 and the power line 119 in the first direction.

A plurality of pixel regions is configured by a red sub pixel region, a green sub pixel region, a blue sub pixel region, and a white sub pixel region to form a unit pixel. In FIG. 3, among them, only two arbitrary sub pixel regions are illustrated as an example, but the present disclosure is not limited thereto. Each of the red, green, blue, and white sub pixel regions includes a light emitting diode and a plurality of pixel driving circuits which independently drives the light emitting diode. The pixel driving circuit may include a switching transistor, a driving transistor, a capacitor, and a sensing transistor.

The power line 119 may be disposed for one or more pixel regions, but the present disclosure is not limited thereto.

Together with the data line 116 and the power line 119, the reference line may be disposed on the same layer as the data line 116 and the power line 119 in the first direction.

When a scan pulse is supplied to the gate line 117, the switching transistor is turned on to supply the data signal supplied to the data line 116 to the capacitor and the first gate electrode 121a of the driving transistor. The switching transistor includes a second gate electrode 121b connected to the gate line 117, a second source electrode 122b connected to the data line 116 through a seventh contact hole 140g, a second drain electrode 123b connected to the first gate electrode 121a through a sixth contact hole 140f, and a second active layer 124b.

The driving transistor controls a current supplied from the power line 119 in accordance with a driving voltage charged in the capacitor to supply a current proportional to the driving voltage to the light emitting diode, thereby causing the light emitting diode to emit light. The driving transistor includes a first gate electrode 121a connected to the second drain electrode 123b through the sixth contact hole 140f, a first source electrode 122a connected to the power line 119 through an eighth contact hole 140h, a first drain electrode 123a connected to the light emitting diode through a third contact hole 140c and a hole H, and a first active layer 124a.

The power line 119 may be connected to the first source electrode 122a in an adjacent pixel region via a bridge line 119a. The bridge line 119a may extend to a pixel region which is adjacent in a direction parallel to the second direction. As described above, the bridge line 119a which extends in the adjacent pixel region may be connected to the first source electrode 122a of the adjacent pixel region through the ninth contact hole 140i.

One side of the bridge line 119a vertically extends along the power line 119 to be connected to the power line 119 therebelow through the eighth contact hole 140h.

Among them, the thin film transistors illustrated in FIGS. 4 to 6 are a driving transistor and a switching transistor and for example, a top gate structure thin film transistor, specifically, a coplanar thin film transistor in which the first gate electrode 121a and the second gate electrode 121b are disposed above the first active layer 124a and the second active layer 124b. However, the present disclosure is not limited thereto and a bottom gate structure thin film transistor in which the gate electrode is disposed below the active layer may also be applied.

The first and second gate electrodes 121a and 121b of the switching transistor and the driving transistor may overlap the first and second active layers 124a and 124b with a gate insulating layer 115b which has substantially the same shape as the first and second gate electrodes 121a and 121b therebetween, respectively.

Specifically, the first and second active layers 124a and 124b may be disposed on the substrate 110.

In this case, a light shielding layer 125 may be disposed below the first active layer 124a and a buffer layer 115a may be disposed between the first active layer 124a and the light shielding layer 125.

The light shielding layer 125 may suppress the first active layer 124a from being affected by light of the outside or a surrounding light emitting diode and may be disposed on the lowest layer of the substrate 110.

The data line 116 and the power line 119 of the present disclosure may be disposed on the same layer as the light shielding layer 125 in the first direction. That is, the data line 116 and the power line 119 of the present disclosure are disposed on the lowest layer of the substrate together with the light shielding layer 125. By doing this, vertical lines of the data line 116 and the power line 119 are disposed on a different layer from the related art, so that insulating layers other than the interlayer insulating layer 115c, for example, the buffer layer 115a and the gate insulating layer 115b are interposed between the vertical lines of the data line 116 and the power line 119 and a horizontal line of the gate line 117 to avoid the short circuit failure.

The buffer layer 115a may be disposed on the substrate 110 to cover the light shielding layer 125, the data line 116, and the power line 119.

The first and second active layers 124a and 124b are formed to overlap the first and second gate electrodes 121a and 121b on the gate insulating layer 115b, respectively, so that channels may be formed between the first source electrode 122a and the first drain electrode 123a and between the second source electrode 122b and the second drain electrode 123b.

The gate insulating layer 115b may be formed of a single layer of silicon nitride SiNx or silicon oxide SiOx which is an inorganic material or a multiple layer of silicon nitride SiNx or silicon oxide SiOx which is an inorganic material.

FIGS. 4 to 6 illustrate that the gate insulating layer 115b is only formed below the first gate electrode 121a and the second gate electrode 121b as an example, but the present disclosure is not limited thereto. The gate insulating layer 115b may be formed on the entire substrate 110 on which the first and second active layers 124a and 124b are formed. In this case, in the gate insulating layer 115b, contact holes through which the first source electrode 122a and the first drain electrode 123a are connected to a source region and a drain region of the first active layer 124a may be formed. Further, in the gate insulating layer 115b, contact holes through which the second source electrode 122b and the second drain electrode 123b are connected to a source region and a drain region of the second active layer 124b may be formed The gate line 117 may be disposed on the same layer as the first and second gate electrodes 121a and 121b. In this case, the above-described gate insulating layer 115b may be disposed below the gate line 117. However, the present disclosure is not limited thereto.

The first and second gate electrodes 121a and 121b and the gate line 117 may be configured by various conductive materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof.

The first and second active layers 124a and 124b may be configured using an oxide semiconductor including one or more metals selected from Zn, Cd, Ga, In, Sn, Hf, and Zr or may be formed of amorphous silicon (a-Si), polycrystalline silicon (poly-Si), or an organic semiconductor.

The first and second source electrodes 122a and 122b may be connected to the source regions of the first and second active layers 124a and 124b through the first and fourth contact holes 140a and 140d which pass through the interlayer insulating layer 115c, respectively. The first and second drain electrodes 123a and 123b may be connected to the drain regions of the first and second active layers 124a and 124b through the second and fifth contact holes 140b and 140e which pass through the interlayer insulating layer 115c, respectively.

The interlayer insulating layer 115c may be formed of a single layer of silicon nitride SiNx or silicon oxide SiOx which is an inorganic material or a multiple layer of silicon nitride SiNx or silicon oxide SiOx which is an inorganic material. As illustrated in FIGS. 4 to 6, the interlayer insulating layer 115c may be formed on the entire substrate 110 or only in the pixel region, but the present disclosure is not limited thereto.

The first and second source electrodes 122a and 122b and the first and second drain electrodes 123a and 123b may be configured by various conductive materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof.

The second drain electrode 123b of the switching transistor upwardly extends to be electrically connected to the first gate electrode 121a of the driving transistor. Specifically, the second drain electrode 123b may be connected to the first gate electrode 121a through the sixth contact hole 140f which passes through the interlayer insulating layer 115c.

The first drain electrode 123a may be connected to the anode 126 of the light emitting diode through the third contact hole 140c and the hole H which pass through the protective layer 115d and the planarization layer 115e.

As described above, in the electroluminescent display device 100 according to the exemplary aspect of the present disclosure, the vertical lines of the data line 116 and the power line 119 are disposed on the substrate 110 in the first direction and the horizontal line of the gate line 117 is disposed in the second direction intersecting the first direction to divide the pixel region together with the vertical lines.

In the electroluminescent display device 100 according to the exemplary aspect of the present disclosure, the vertical lines of the data line 116 and the power line 119 are disposed on the same layer as the light shielding layer 125 which is the lowest layer and the horizontal line of the gate line 117 is disposed on the same layer as the first and second gate electrodes 121a and 121b. Therefore, the gate insulating layer 115b and the buffer layer 115a may be interposed between the vertical lines and the horizontal line, rather than the interlayer insulating layer 115c of the related art. In this case, the gate insulating layer 115b and the buffer layer 115a are irrelevant to the capacity of the capacitor, so that the thickness of the gate insulating layer 115b and/or the buffer layer 115a is increased to avoid the short circuit failure generated at the intersection of the vertical lines and the horizontal line.

That is, in the related art, a gate redundancy pattern needs to be formed to repair the short circuit failure between the horizontal line of the gate line and the vertical line of the data line/power line. However, only an interlayer insulating layer is interposed between intersections of the horizontal line and the vertical line so that a static electrical failure is caused due to a short distance, a short circuit between the horizontal line and the vertical line due to the foreign matter, or a failure due to the state of an insulating layer above the gate line may be caused. Therefore, a structure for repair needs to be designed in the pixel to improve a yield. Therefore, in the related art, the gate redundancy pattern is applied to a position where the horizontal line and the vertical line intersect each other. The gate redundancy pattern is formed to occupy a predetermined region above and below the gate line so that it causes the reduction of the aperture ratio in the pixel. Further, due to the addition of the gate redundancy pattern in the pixel, it is difficult to design the pixels in a high resolution model.

According to the exemplary aspect of the present disclosure, it is noted that only the interlayer insulating layer 115c is interposed between the intersections of the horizontal line and the vertical line so that the intersections are vulnerable to the short circuit failure and the short circuit failure is affected by the distance spaced between lines. Therefore, the data line 116 and the power line 119 are disposed on a layer which is different from that of the related art, so that not the interlayer insulating layer 115c as in the related art, but the gate insulating layer 115b and the buffer layer 115a may be interposed between the horizontal line and the vertical line. In this case, the gate insulating layer 115b and the buffer layer 115a are irrelevant to the capacity of the capacitor, so that the thickness of the gate insulating layer 115b and/or the buffer layer 115a is increased to avoid the short circuit failure generated at the intersection of the vertical line and the horizontal line.

Therefore, a gate redundancy pattern in the pixel may be omitted so that the pixel may be easily designed and a yield is improved in the high resolution model, and an additional aperture ratio is ensured.

As described above, only an interlayer insulating layer is interposed between intersections of the horizontal line and the vertical line so that a static electrical failure is caused by a short distance, a short circuit between the horizontal line and the vertical line due to the foreign matter or a failure due to the state of the insulating layer above the gate line may be caused. Therefore, a structure for repair needs to be designed in the pixel to improve a yield. Therefore, in the related art, the gate redundancy pattern is applied to a position where the horizontal line and the vertical line intersect each other. The gate redundancy pattern is formed to occupy a predetermined area above and below the gate line so that the opening unit in the pixel is reduced.

This is because the interlayer insulating layer needs to be interposed between the vertical line and the horizontal line and the thickness of the interlayer insulating layer needs to be increased to remove the gate redundancy pattern, but it is hard to increase the thickness of the interlayer insulating layer in order to ensure the capacity of the capacitor.

In contrast, as described above, according to the exemplary aspect of the present disclosure, the vertical lines of the data line 116 and the power line 119 are disposed on the same layer as the light shielding layer 125 so that two insulating layers of the gate insulating layer 115b and the buffer layer 115a are interposed between the vertical line and the horizontal line. In this case, the gate insulating layer 115b and the buffer layer 115a are irrelevant to the capacity of the capacitor, so that the thickness of the gate insulating layer 115b and/or the buffer layer 115a is increased to avoid the short circuit failure generated at the intersection of the vertical line and the horizontal line. Accordingly, the gate redundancy pattern in the pixel may be removed so that the opening unit A may expand as much as the gate redundancy pattern, the pixel design in the high resolution model may be facilitated, and the yield may be improved.

Next, the protective layer 115d and the planarization layer 115e may be disposed on the thin film transistor. The protective layer 115d protects the thin film transistor, the gate driver disposed outside the pixel region, and other wiring lines. The planarization layer 115e is an insulating layer which planarizes the upper portion of the substrate 110 by making a step on the substrate 110 gentle.

The planarization layer 115e may be formed of an organic insulating material. That is, the planarization layer 115e may be formed of any one of acrylic resin, epoxy resin, phenol resin, polyamide resin, polyimide resin, unsaturated polyester resin, polyphenylene resin, polyphenylene sulfide resin, benzocyclobutene, and photoresist, but is not limited thereto.

In a predetermined region of the circuit unit, the planarization layer 115e is removed to form the hole H which exposes a part of a surface of the protective layer 115d and the second drain electrode 123a therebelow exposed through a third contact hole 140c.

Referring to FIG. 4, a light emitting diode may be disposed on the planarization layer 115e. For example, as an organic light emitting diode, the light emitting diode includes an anode 126 which is formed on the planarization layer 115e to be electrically connected to the first drain electrode 123a of the transistor, an organic light emitting layer 127 disposed on the anode 126, and a cathode 128 which is formed on the organic light emitting layer 127.

The anode 126 may be disposed inside the hole H and on the planarization layer 115e and is electrically connected to the first drain electrode 123a through the third contact hole 140c and the hole H formed on the protective layer 115d and the planarization layer 115e. The anode 126 may be formed of a conductive material having a high work function to supply holes to the organic light emitting layer 127. For example, the anode 126 may be formed of a transparent conductive material such as indium tin oxide (ITO), indium zinc oxide (IZO), and indium tin zinc oxide (ITZO).

The anode 126 disposed inside the hole H overlaps a part (for the sake of convenience, referred to as a storage electrode) of the second drain electrode 123b below the protective layer 115d with the protective layer 115d interposed therebetween to configure a first capacitor. Further, the part of the second drain electrode 123b, that is, the storage electrode overlaps a part of the first active layer 124a below the interlayer insulating layer 115c with the interlayer insulating layer 115c interposed therebetween to configure a second capacitor. As described above, according to the exemplary aspect of the present disclosure, the first capacitor and the second capacitor are connected in parallel to increase a capacity of the entire capacitors. Simultaneously, as described above, the thickness of the protective layer 115d and the interlayer insulating layer 115c is reduced so that capacities of the first capacitor and the second capacitor may be increased as compared with the related art. For example, the protective layer 115d and the interlayer insulating layer 115c according to the exemplary aspect of the present disclosure may have smaller thicknesses than those of the gate insulating layer 115b and the buffer layer 115a.

In FIGS. 3 and 4, for example, it is illustrated that the anode 126 is electrically connected to the first drain electrode 123a of the driving transistor, but the present disclosure is not limited thereto. Therefore, depending on a type of the thin film transistor and a design method of the driving circuit, the anode 126 may be electrically connected to the first source electrode 122a of the driving transistor.

The organic light emitting layer 127 is an organic layer which emits light of a specific color and may include any one of a red organic light emitting layer, a green organic light emitting layer, a blue organic light emitting layer, and a white organic light emitting layer. Further, the organic light emitting layer 127 may further include various organic light emitting layers such as a hole transport layer, a hole injecting layer, an electron injecting layer, or an electron transport layer. In FIG. 4, it is illustrated that the organic light emitting layer 127 is patterned for every pixel, but the present disclosure is not limited thereto and the organic light emitting layer 127 may be a common layer which is commonly formed for a plurality of pixels.

The cathode 128 may be disposed on the organic light emitting layer 127. The cathode 128 may supply electrons to the organic light emitting layer 127. The cathode 128 may be formed of transparent conductive oxide such as indium tin oxide (ITO), indium zinc oxide (IZO), indium tin zinc oxide (ITZO), zinc oxide (ZnO), and tin oxide (TO) or an ytterbium (Yb) alloy. Alternatively, the cathode 128 may be formed of a conductive material.

Next, referring to FIGS. 4 to 6, a bank 115f may be disposed on the anode 126 and the planarization layer 115e. The bank 115f may cover a part of the anode 126 of the organic light emitting diode or a part of the wiring line. The bank 115f may be disposed to divide adjacent pixels in the pixel region.

The bank 115f may be formed of an organic insulating material. For example, the bank 115f may be formed of polyimide, acryl, or benzocyclobutene (BCB) resin, but the present disclosure is not limited thereto.

The bank 115f may be disposed on the planarization layer 115e to enclose the light emitting unit and the bank 115f may be disposed to cover the bridge line 119a therebelow.

An encapsulating unit (not illustrated) for protecting the organic light emitting diode which is vulnerable to the moisture so as not to be exposed to the moisture may be formed above the organic light emitting diode configured as described above. For example, the encapsulating unit may have a structure in which an inorganic layer and an organic layer are alternately laminated, but, the present disclosure is not limited thereto.

In the meantime, similarly to the electroluminescent display device described above, a contact hole is formed in the insulating layer so that components above and below the insulating layer with at least one insulating layer interposed therebetween are in contact (or connected) with each other. In the meantime, a contact structure of the related art has a structure in which a contact hole is covered by upper and lower components, for example, an upper electrode and a lower electrode. In this case, a size (or an area) of the contact hole is the same as a contact area where the upper and lower electrodes are in contact with each other.

In this case, in the related art, there is a restriction in a pixel design due to a minimum size for patterning a contact hole.

Further, an overlay margin is necessary between the lower electrode and the contact hole and between the upper electrode and the contact hole and thus a degree of freedom of metal in the pixel design is reduced. That is, since the upper electrode needs to cover the contact hole so that the lower electrode is not damaged by an etchant of the upper electrode, a margin for the upper electrode is necessary. Further, in order to pattern the contact hole so as not to deviate from the lower electrode, a margin for the lower electrode is also necessary. The contact structure of the related art as described above requires margins for the upper and lower electrodes so that the degree of freedom of metal is reduced in the pixel design.

Therefore, according to the exemplary aspect of the present disclosure, it is noted that the above-described margin of the contact hole is generated because a size (or an area) of the contact hole is equal to a contact area and when different contact hole structures are applied in consideration of a characteristic of the lower layer, the pixel may be designed regardless of the size of the contact hole. Therefore, a contact structure in which the pixel may be designed regardless of the size of the contact hole by designing a size (or an area) of the contact hole to be larger than the contact area and applying different structures depending on the characteristics of the lower layer is disclosed.

That is, the size (or an area) of the contact hole is designed to be larger than the contact area and two existing contact holes are combined depending on the characteristic of the lower layer, a contact portion is formed on a side of metal or an upper electrode is formed to enclose the lower electrode in the form of a clad. Therefore, the pixel may be designed regardless of the size of the contact hole. That is, when the size (or area) of the contact hole is designed to be larger than the contact area, the above-described margins for the upper and lower electrodes are not necessary so that the pixel may be designed regardless of the size of the contact hole. Hereinafter, an example that the contact structure of the present disclosure is implemented to the above-described electroluminescent display device will be described in detail with reference to the drawings.

As described above, the contact structure according to the exemplary aspect of the present disclosure is applied to a part of the electroluminescent display device 100 according to the exemplary aspect of the present disclosure illustrated in FIGS. 3, 5 and 6.

Figure 7A:
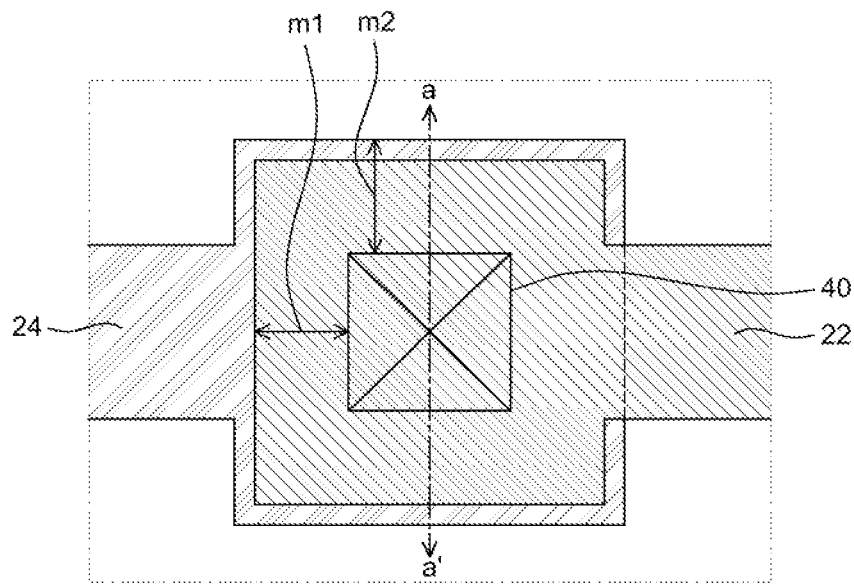
FIGS. 7A and 7B are a plan view and a cross-sectional view illustrating a contact structure according to a comparative example.
Figure 7B:
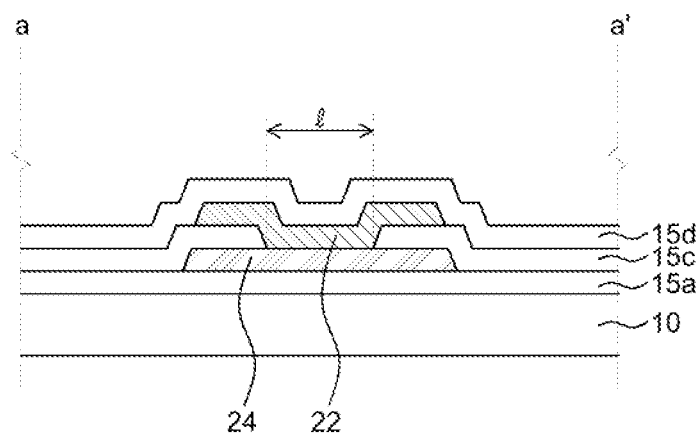
Figure 8A:
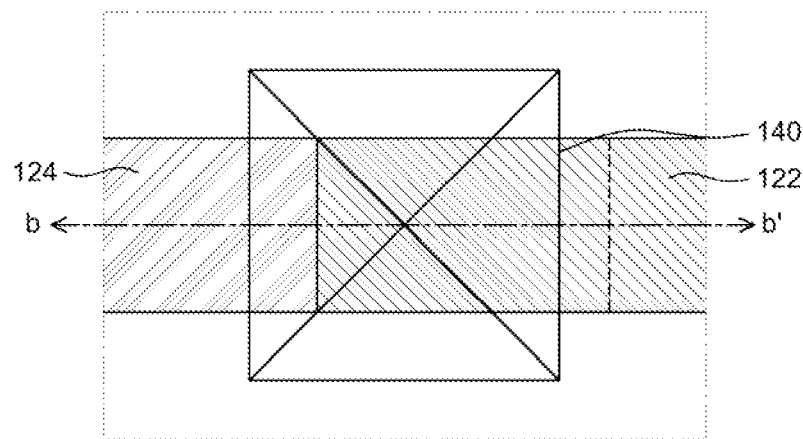
FIGS. 8A and 8B are a plan view and a cross-sectional view illustrating a contact structure according to an exemplary aspect of the present disclosure.
Figure 8B:
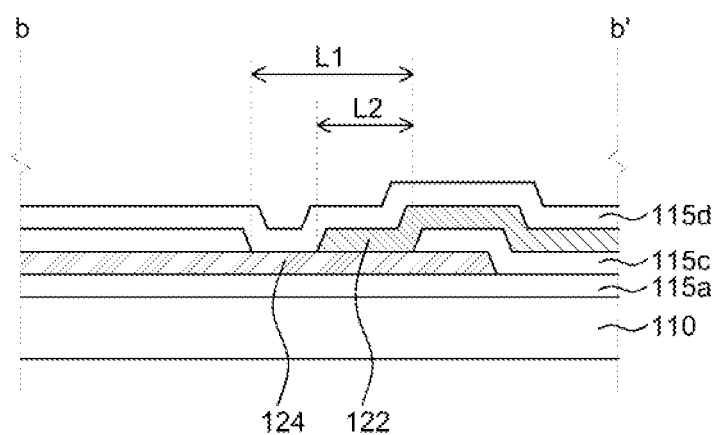

FIGS. 7A and 7B are a plan view and a cross-sectional view illustrating a contact structure according to a comparative example. FIGS. 8A and 8B are a plan view and a cross-sectional view illustrating a contact structure according to an exemplary aspect of the present disclosure as an example.

FIG. 7B schematically illustrates a part of a cross-section taken along the line a-a' in a contact structure according to a comparative aspect illustrated in FIG. 7A. FIG. 8B schematically illustrates a part of a cross-section taken along the line b-b' in a contact structure according to an exemplary aspect illustrated in FIG. 8A.

Referring to FIGS. 7A and 7B, a contact structure according to a comparative example includes a lower layer 24 on the substrate 10, an interlayer insulating layer 15c which is disposed on the lower layer 24 and has a contact hole 40 to expose a part of the lower layer 24, and an upper layer 22 which is disposed on the interlayer insulating layer 15c to be in contact with the lower layer 24 through the contact hole 40.

In this case, a buffer layer 15a is further disposed below the lower layer 24.

The lower layer 24 is an active layer formed of a semiconductor and the upper layer 22 is a source electrode formed of a conductive material.

The contact structure according to the comparative example has a structure in which upper and lower components, for example, upper and lower layers 22 and 24 cover the contact hole 40. In this case, a size (or an area) of the contact hole 40 is the same as a contact area where the upper and lower layers 22 and 24 are in contact with each other. It is understood that a length 1 of FIG. 7B is a width of the contact hole 40 and is equal to a width of a contact portion where the upper and lower layers 22 and 24 are in contact with each other.

In this case, in the related art, there is a restriction in a pixel design due to a minimum size for patterning the contact hole 40.

Further, overlay margins m1 and m2 are necessary between the upper layer 22 and the contact hole 40 and between the lower layer 24 and the contact hole 40 so that a degree of freedom of metal in the pixel design is reduced. That is, an upper overlay margin m1 is necessary because the upper layer 22 needs to cover the contact hole 40 so that the lower layer 24 is not damaged by the etchant of the upper layer 22. Further, the overlay margin m2 is also necessary for the lower layer 24 to pattern the contact hole 40 so as not to deviate from the lower layer 24. As described above, in the contact structure of the comparative example, overlay margins m1 and m2 are necessary for the upper and lower layers 22 and 24 so that the degree of freedom of metal in the pixel design is reduced.

Referring to FIGS. 8A and 8B, a contact structure according to the exemplary aspect of the present disclosure includes a lower layer 124 on the substrate 110, an interlayer insulating layer 115c which is disposed on the lower layer 124 and has a contact hole 140 to expose a part of the lower layer 124, and an upper layer 122 which is disposed on the interlayer insulating layer 115c to be in contact with the lower layer 124 through the contact hole 140.

In this case, a buffer layer 115a may be further disposed below the lower layer 124. The contact hole 140 has an opening exposing a portion of the lower layer 124 that is not in contact with the upper layer 122. Then, the protective layer 115d is formed on the substrate 110 so as to be filled (or embedded) in the opening.

The lower layer 124 is an active layer formed of a semiconductor and the upper layer 122 is a source electrode formed of a conductive material, but the present disclosure is not limited thereto.

In this case, the exemplary aspect of the present disclosure discloses a contact structure in which a size (or an area) of the contact hole 140 is designed to be larger than the contact area and different structures are applied depending on the characteristic of the lower layer 124, so that the pixel may be designed regardless of a size of the contact hole 140. That is, for example, it is understood that a length L1 of FIG. 8B is a width of the contact hole 140 and is relatively longer than a width L2 of a contact portion where the upper and lower layers 122 and 124 are in contact with each other. As described above, when the size (or area) of the contact hole is designed to be larger than the contact area, the above-described upper and lower overlay margins are not necessary so that the pixel may be designed regardless of the size of the contact hole 140.

The contact hole 140 may expose a part of an upper surface of the lower layer 124 and a part of an upper surface of the buffer layer 115a. Further, the upper layer 122 may be in contact with the exposed part of the upper surface of the lower layer 124 and the exposed part of the upper surface of the buffer layer 115a.

The above-described case is suitable for a case where the upper layer 122 is etched, the lower layer 124 is not damaged. If the lower layer is damaged, another structure may be applied.

Hereinafter, a specific contact structure according to a characteristic of the lower layer will be described in detail.

For the convenience of description, the contact hole may be divided into three types depending on the type of upper and lower layers. A type refers to contact between the source/drain electrodes and the active layer, G type refers to contact between the gate electrode and the source/drain electrodes, and L type refers to contact between the vertical line and the source/drain electrodes.

Further, the contact hole is classified into four cases depending on the type and the characteristic of the lower layer.

The first case is the above-described A type and the active layer which is a lower layer does not respond to the etchant of the source/drain electrodes which are the upper layer. In this case, the area of the contact hole may be designed to be larger than the contact area.

Next, in the second case, two contact holes which are used in the related art is combined as one contact hole and for example, the second case may be applied to the L type.

Next, the third case and the fourth case may be applied to the above-described G type and may also be applied even when the upper and lower layers are formed of the same material such as copper. Therefore, the degree of freedom of metal may be increased.

Among them, in the third case, the contact portion is formed at the side of the lower layer so that the area of the contact hole may be reduced. Further, the fourth case is a structure in which the upper layer encloses the lower layer in the form of clad and is appropriate for protecting the lower layer.

Figure 9A:
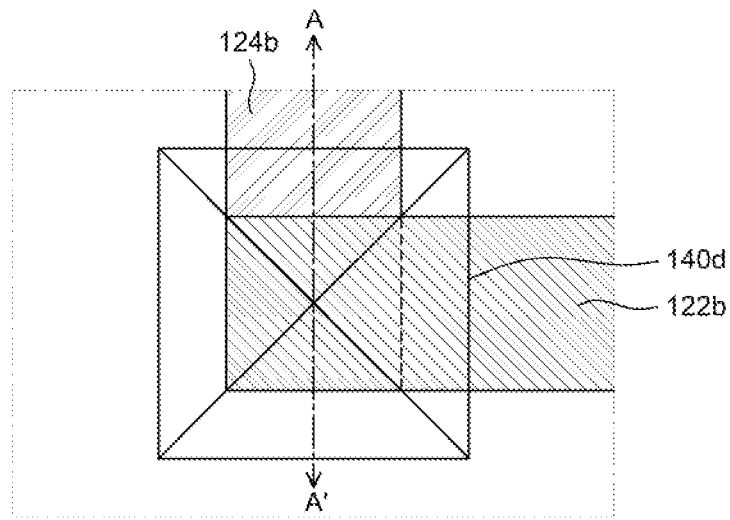
FIGS. 9A and 9B are a plan view and a cross-sectional view schematically illustrating an example of a contact structure according to an exemplary aspect of the present disclosure.
Figure 9B:
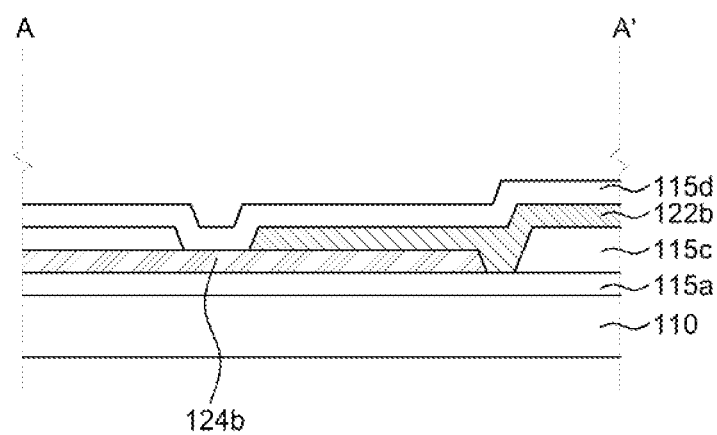
Figure 10:
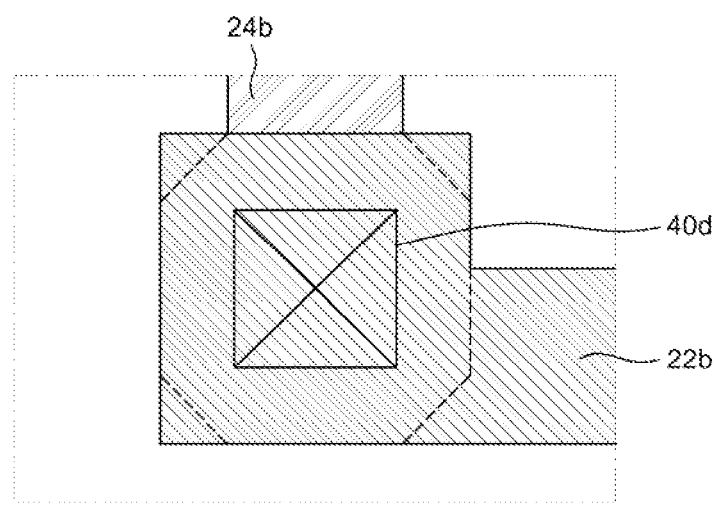
FIG. 10 is a plan view illustrating an example of a contact structure according to a comparative example.

FIGS. 9A and 9B are a plan view and a cross-sectional view schematically illustrating an example of a contact structure according to an exemplary aspect of the present disclosure. FIG. 10 is a plan view illustrating an example of a contact structure according to a comparative example.

In this case, FIGS. 9A and 9B illustrate the first case of the A type as an example and the first case may be applied to the fourth contact hole 140d illustrated in FIG. 3. FIG. 9B schematically illustrates a part of a cross-section taken along the line A-A' in a contact structure according to an exemplary aspect illustrated in FIG. 9A.

Referring to FIGS. 9A and 9B, a contact structure according to an exemplary aspect of the present disclosure includes a lower layer on the substrate 110, for example, a second active layer 124b, an interlayer insulating layer 115c which is disposed on the second active layer 124b and has a fourth contact hole 140d to expose a part of the second active layer 124b, and an upper layer, for example, a second source electrode 122b which is disposed on the interlayer insulating layer 115c to be in contact with the second active layer 124b through the fourth contact hole 140d.

In this case, a buffer layer 115a may be further disposed below the second active layer 124b. The fourth contact hole 140d has an opening exposing a portion of the second active layer 124b that is not in contact with the second source electrode 122b. Then, the protective layer 115d is formed on the substrate 110 so as to be filled (or embedded) in the opening.

The second active layer 124b may be configured by a semiconductor and the second source electrode 122b may be configured by a conductive material.

The fourth contact hole 140d according to the exemplary aspect of the present disclosure may have a relatively larger area than the contact area where the second source electrode 122b and the second active layer 124b are in contact (or connected) with each other.

In this case, the fourth contact hole 140d may expose a part of an upper surface and the side of the second active layer 124b and a part of an upper surface of the buffer layer 115a. Further, the second source electrode 122b may be in contact with the exposed part of the upper surface and the side of the second active layer 124b and the exposed part of the upper surface of the buffer layer 115a.

The above-described first case is appropriate for a case where the upper layer is etched, the lower layer is not damaged.

In contrast, referring to FIG. 10, in the comparative example, it is understood that a size of the fourth contact hole 40d is equal to the contact area where the second source electrode 22b and the second active layer 24b are in contact (or connected) with each other. In this case, as described above, upper and lower overlay margins are necessary for forming the fourth contact hole 40d.

Figure 11A:
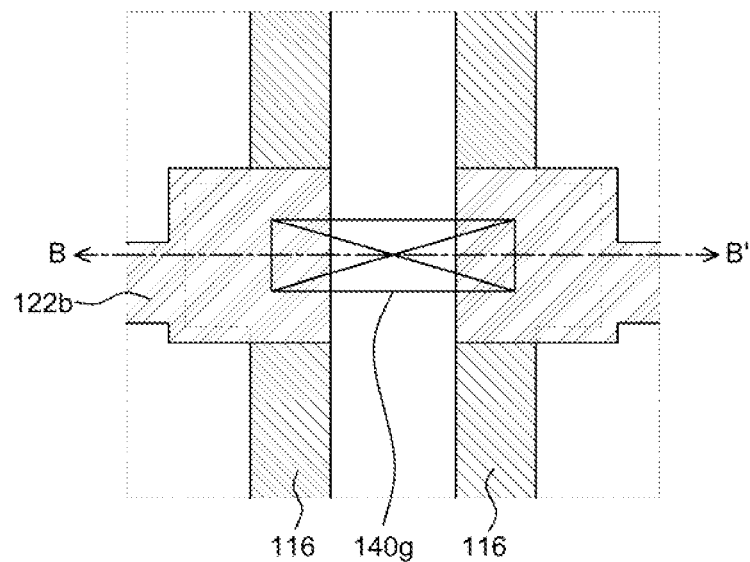
FIGS. 11A and 11B are a plan view and a cross-sectional view schematically illustrating another example of a contact structure according to an exemplary aspect of the present disclosure.
Figure 11B:
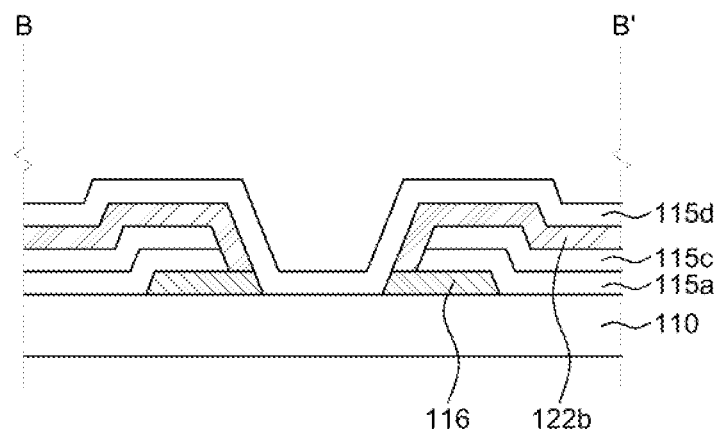
Figure 12:
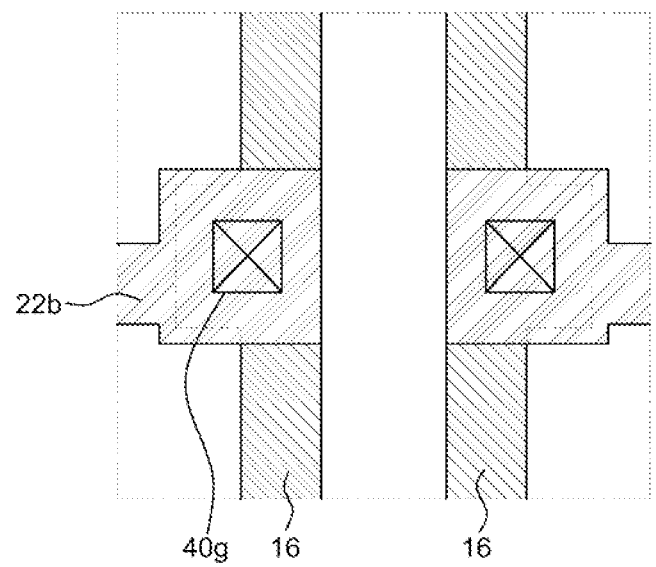
FIG. 12 is a plan view illustrating another example of a contact structure according to a comparative example.

FIGS. 11A and 11B are a plan view and a cross-sectional view schematically illustrating another example of a contact structure according to an exemplary aspect of the present disclosure. FIG. 12 is a plan view illustrating another example of a contact structure according to a comparative example.

In this case, FIGS. 11A and 11B illustrate the second case of the L type as an example and the second case may be applied to the seventh contact hole 140g illustrated in FIG. 3. FIG. 11B schematically illustrates a part of a cross-section taken along the line B-B' in a contact structure according to an exemplary aspect illustrated in FIG. 11A.

Referring to FIGS. 11A and 11B, as another example, a contact structure according to an exemplary aspect of the present disclosure includes a lower layer on the substrate 110, for example, a data line 116, a buffer layer 115a which is disposed on the data line 116 and has a seventh contact hole 140g to expose a part of the data line 116, an interlayer insulating layer 115c, and an upper layer, for example, a second source electrode 122b which is disposed on the interlayer insulating layer 115c to be in contact with the data line 116 through the seventh contact hole 140g.

The data line 116 is configured by a first conductive material and the second source electrode 122b may be configured by a second conductive material. In this case, the first conductive material and the second conductive material may be formed of different materials. The seventh contact hole 140g has an opening exposing a portion of the substrate 110 that is not in contact with the second source electrode 122b. Then, the protective layer 115d is formed on the substrate 110 so as to be filled (or embedded) in the opening.

The seventh contact hole 140g according to the exemplary aspect of the present disclosure may have a relatively larger area than the contact area where the second source electrode 122b and the data line 116 are in contact (or connected) with each other.

In this case, the data line 116 may configure two adjacent wiring lines and each of second source electrodes 122b may be connected to each of data lines 116 through one seventh contact hole 140g.

The seventh contact hole 140g may expose a part of an upper surface of each data line 116, one side of the data line 116, and an upper surface of the substrate between two data lines 116.

In this case, each second source electrode 122b may be in contact with the exposed part of the upper surface of the data line 116. In contrast, one side of the data line 116 which is not in contact with the second source electrode 122b may be exposed without being covered by the buffer layer 115a and the interlayer insulating layer 115c.

The above-described second case is appropriate to combine two contact holes as one contact hole.

In contrast, referring to FIG. 12, it is understood that in the comparative example, a size of the seventh contact hole 40g is equal to the contact area where the second source electrode 22b and the data line 16 are in contact (or connected) with each other. The seventh contact hole 40g is individually applied to the contact of the second source electrode 22b and the data line 16.

Figure 13A:
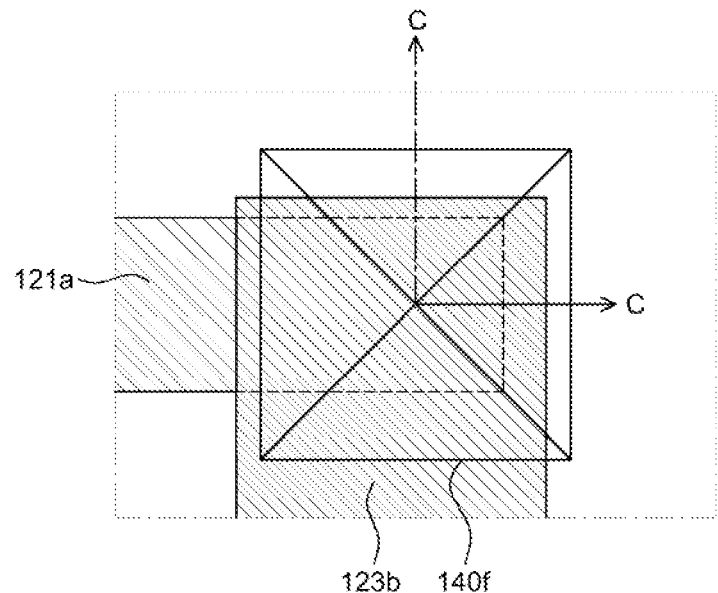
FIGS. 13A and 13B are a plan view and a cross-sectional view schematically illustrating still another example of a contact structure according to an exemplary aspect of the present disclosure.
Figure 13B:
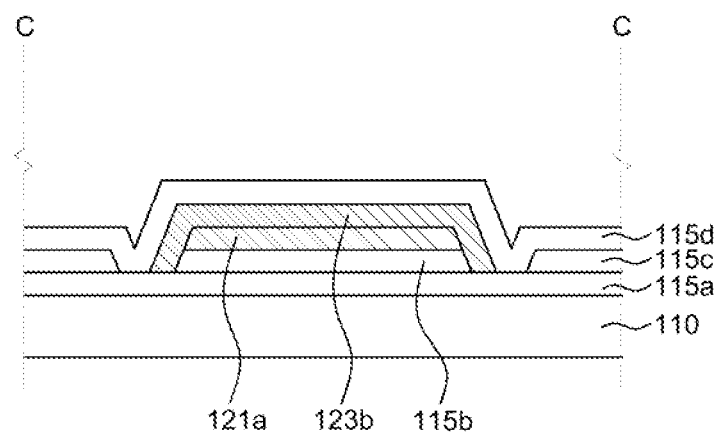
Figure 14:
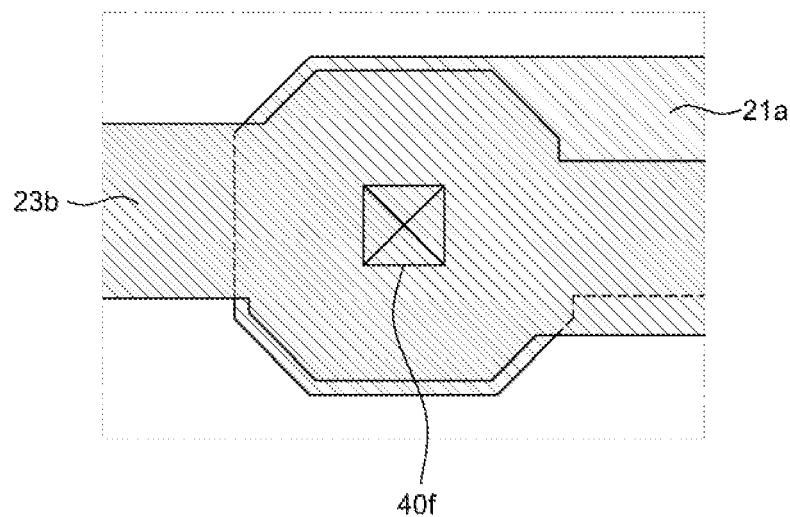
FIG. 14 is a plan view illustrating still another example of a contact structure according to a comparative example.

FIGS. 13A and 13B are a plan view and a cross-sectional view schematically illustrating still another example of a contact structure according to an exemplary aspect of the present disclosure. FIG. 14 is a plan view illustrating still another example of a contact structure according to a comparative example.

In this case, FIGS. 13A and 13B illustrate the fourth case of the G type as an example and the fourth case may be applied to the sixth contact hole 140f illustrated in FIG. 3. FIG. 13B schematically illustrates a part of a cross-section taken along the line C-C in a contact structure according to an exemplary aspect illustrated in FIG. 13A.

Referring to FIGS. 13A and 13B, as another example, the contact structure according to the exemplary aspect of the present disclosure includes a lower layer on the substrate 110, for example, a first gate electrode 121a, an interlayer insulating layer 115c which is disposed on the first gate electrode 121a and some part of the interlayer insulating layer 115c is removed so that the interlayer insulating layer 115c has the sixth contact hole 140f to expose the first gate electrode 121a, and an upper layer, for example, a second drain electrode 123b which is in contact with the first gate electrode 121a within the sixth contact hole 140f. The lower layer and the upper layer may be sequentially stacked within the sixth contact hole 140f.

The first gate electrode 121a may be configured by the first conductive material. The second drain electrode 123b may be configured by the second conductive material. In this case, the first conductive material and the second conductive material may be formed of the same material. However, the present disclosure is not limited thereto and the first conductive material and the second conductive material may be formed of different materials.

A buffer layer 115a may be disposed below the first gate electrode 121a with the gate insulating layer 115b interposed therebetween. The sixth contact hole 140f has an opening exposing a portion of the buffer layer 115a that is not in contact with the second drain electrode 123b. Then, the protective layer 115d is formed on the substrate 110 so as to be filled (or embedded) in the opening.

The sixth contact hole 140f according to the exemplary aspect of the present disclosure may have a relatively larger area than the contact area where the first gate electrode 121a and the second drain electrode 123b are in contact (or connected) with each other.

In this case, for example, the sixth contact hole 140f may expose an upper surface of the first gate electrode 121a, both sides of the first gate electrode 121a, and a part of an upper surface of the buffer layer 115a and both sides of the gate insulating layer 115b.

In this case, the second drain electrode 123b may be in contact with the exposed upper surface of the first gate electrode 121a, both sides of the first gate electrode 121a, and the exposed part of the upper surface of the buffer layer 115a and both sides of the gate insulating layer 115b.

Further, the second drain electrode 123b may have a clad structure which covers and encloses the exposed upper surface of the first gate electrode 121a and both sides of the first gate electrode 121a.

The above-described fourth case may be applied even when the upper and lower layers are formed of the same material so that the degree of freedom of metal is increased. Further, the lower layer is enclosed by the upper layer in the form of clad, so that it is appropriate for protection of the lower layer.

In contrast, referring to FIG. 14, in the comparative example, it is understood that a size of the sixth contact hole 40f is equal to the contact area where the first gate electrode 21a and the second drain electrode 23b are in contact (or connected) with each other.

Figure 15A:
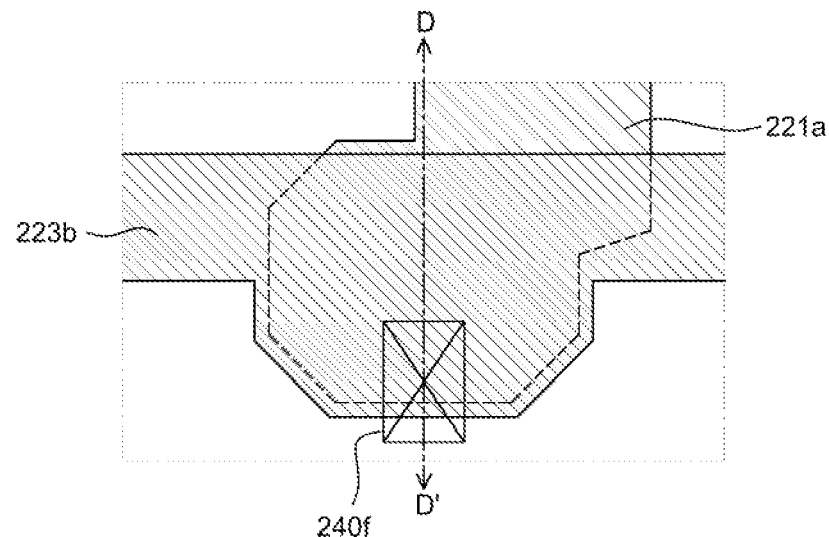
FIGS. 15A and 15B are a plan view and a cross-sectional view schematically illustrating still another example of a contact structure according to an exemplary aspect of the present disclosure.
Figure 15B:
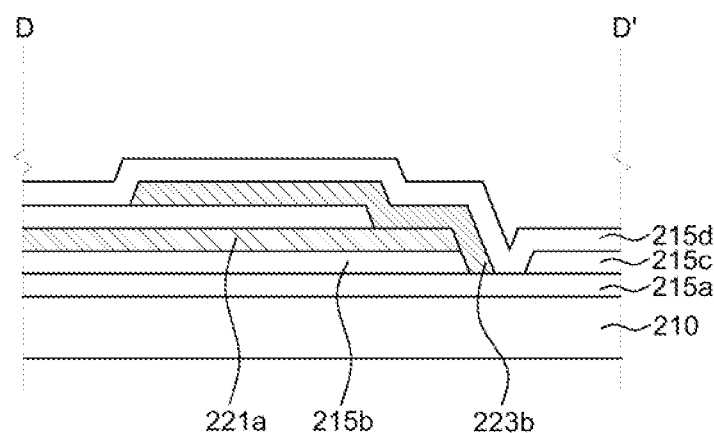

FIGS. 15A and 15B are a plan view and a cross-sectional view schematically illustrating still another example of a contact structure according to an exemplary aspect of the present disclosure.

In this case, FIGS. 15A and 15B illustrate the third case of the G type as an example and the third case may also be applied to the sixth contact hole illustrated in FIG. 3. FIG. 15B schematically illustrates a part of a cross-section taken along the line D-D' in a contact structure according to an exemplary aspect illustrated in FIG. 15A.

Referring to FIGS. 15A and 15B, as another example, the contact structure according to the exemplary aspect of the present disclosure includes a lower layer on the substrate 210, for example, a first gate electrode 221a, an interlayer insulating layer 215c which is disposed on the first gate electrode 221a and has the sixth contact hole 240f to expose a part of the first gate electrode 221a, and an upper layer, for example, a second drain electrode 223b which is in contact with the first gate electrode 221a through the sixth contact hole 240f.

The first gate electrode 221a may be configured by the first conductive material. The second drain electrode 223b may be configured by the second conductive material. In this case, the first conductive material and the second conductive material may be formed of the same material. However, the present disclosure is not limited thereto and the first conductive material and the second conductive material may be formed of different materials.

A buffer layer 215a may be disposed below the first gate electrode 221a with the gate insulating layer 215b interposed therebetween. The sixth contact hole 240f has an opening exposing a portion of the buffer layer 215a that is not in contact with the second drain electrode 223b. Then, the protective layer 215d is formed on the substrate 210 so as to be filled (or embedded) in the opening.

The sixth contact hole 240f according to the exemplary aspect of the present disclosure may have a relatively larger area than the contact area where the first gate electrode 221a and the second drain electrode 223b are in contact (or connected) with each other.

In this case, as an example, the sixth contact hole 240f may expose a part of an upper surface and a side of the first gate electrode 221a, a part of a side of the gate insulating layer 215b, and a part of an upper surface of the buffer layer 215a.

In this case, the second drain electrode 223b may be in contact with the exposed part of the upper surface and the side of the first gate electrode 221a, the exposed part of the upper surface of the buffer layer 215a, and the exposed part of the side of the gate insulating layer 215b.

The third case may be applied even when the upper and lower layers are formed of the same material so that the degree of freedom of metal is increased. Therefore, the area may be reduced.

The exemplary aspects of the present disclosure can also be described as follows:

A contact structure according to an exemplary aspect of the present disclosure includes: a lower layer; at least a first insulating layer on the lower layer, the first insulating layer having a predetermined contact hole to expose a part of the lower layer; and an upper layer on the first insulating layer to be in contact with the lower layer through the contact hole in which the contact hole has a relatively larger area than a contact area where the upper layer and the lower layer are in contact with each other.

According to another aspect of the present disclosure, the contact structure may further include a second insulating layer below the lower layer.

According to another aspect of the present disclosure, the lower layer may be configured by a semiconductor and the upper layer may be configured by a conductive material.

According to another aspect of the present disclosure, the contact hole may expose a part of an upper surface and a side of the lower layer and a part of an upper surface of the second insulating layer.

According to another aspect of the present disclosure, the upper layer may be in contact with the exposed part of the upper surface and the side of the lower layer and the exposed part of the upper surface of the second insulating layer.

According to another aspect of the present disclosure, the lower layer may be configured by a first conductive material and the upper layer may be configured by a second conductive material.

According to another aspect of the present disclosure, the first conductive material and the second conductive material may be made of different materials.

According to another aspect of the present disclosure, the lower layer may configure two adjacent wiring lines and the upper layer may configure two electrodes which are respectively connected to the wiring lines through the contact hole.

According to another aspect of the present disclosure, the contact hole may expose a part of an upper surface and a side of each wiring line, and an upper surface of the substrate between two wiring lines.

According to another aspect of the present disclosure, each electrode may be in contact with the exposed part of the upper surface of each wiring line.

According to another aspect of the present disclosure, one side of the wiring line which is not in contact with the upper layer may be exposed.

According to another aspect of the present disclosure, the first conductive material and the second conductive material may be made of the same material.

According to another aspect of the present disclosure, the contact structure may further include a second insulating layer interposed between the lower layer and the first insulating layer.

A contact structure according to an exemplary aspect of the present disclosure includes: at least a first insulating layer on a substrate, the first insulating layer having a predetermined contact hole; and a lower layer and an upper layer sequentially stacked and contacted with each other within the contact hole, wherein the contact hole has a relatively larger area than a contact area where the upper layer and the lower layer are in contact with each other.

According to another aspect of the present disclosure, the contact structure may further comprise a second insulating layer below the first insulating layer on the substrate, the contact hole may expose the upper surface and both sides of the upper layer, and a part of the upper surface of the second insulating layer.

According to another aspect of the present disclosure, the upper layer may be in contact with the exposed upper surface and both sides of the lower layer and the exposed part of the upper surface of the second insulating layer.

According to another aspect of the present disclosure, the upper layer may be configured of a clad structure which covers and encloses the upper surface of the lower layer and the both sides of the lower layer.

According to another aspect of the present disclosure, the contact structure may further comprise a third insulating layer below the lower layer, the contact hole may expose a part of an upper surface and a side of the lower layer, a part of an upper surface of the second insulating layer, and a part of a side of the third insulating layer.

According to another aspect of the present disclosure, the upper layer may be in contact with the exposed part of the upper surface and the side of the lower layer, the exposed part of the second insulating layer, and the exposed part of the side of the third insulating layer.

A display device according to an exemplary aspect of the present disclosure includes: a data line on a substrate in a first direction, a first insulating layer on the data line, an active layer on the first insulating layer, a gate line on the first insulating layer with at least second insulating layer interposed therebetween in a second direction intersecting the first direction to divide a pixel region together with the data line, a gate electrode above the active layer with the second insulating layer interposed therebetween, a third insulating layer on the gate electrode and the gate line, a source electrode and a drain electrode on the third insulating layer, a fourth insulating layer on the source electrode and the drain electrode, a light emitting diode in a light emitting unit of the pixel region above the fourth insulating layer; and a contact hole configured in at least one insulating layer among the first insulating layer to the fourth insulating layer to allow components above and below the at least one insulating layer to be in contact with each other, in which the contact hole has a relatively larger area than a contact area in which the components above and below the at least one insulating layer are in contact with each other.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A contact structure for a display device, comprising:
a lower layer;
a first insulating layer disposed on the lower layer and having a contact hole to expose a part of the lower layer;
an upper layer disposed on the first insulating layer contacting the lower layer through the contact hole; and
a second insulating layer disposed below the lower layer,
wherein the lower layer is formed of a semiconductor and the upper layer is formed of a conductive material,
wherein the contact hole exposes a part of an upper surface of the lower layer, a side of the lower layer and a part of an upper surface of the second insulating layer.

2. The contact structure according to claim 1, wherein the contact hole has an area greater than an area where the upper layer and the lower layer are in contact with each other.

3. The contact structure according to claim 1, wherein the upper layer is in contact with the exposed part of the upper surface of the lower layer, the side of the lower layer and the exposed part of the upper surface of the second insulating layer.

4. The contact structure according to claim 1, wherein the lower layer is not damaged by an etchant of the upper layer.

5. The contact structure according to claim 1, wherein in the contact hole, the exposed portion of the upper surface of the lower layer is composed of a portion not in contact with the upper layer and a portion in contact with the upper layer.

* * * * *